(12) United States Patent
Chen et al.

(10) Patent No.: US 11,991,853 B2
(45) Date of Patent: May 21, 2024

(54) CABLE CLIP

(71) Applicant: Quanta Computer Inc., Taoyuan (TW)

(72) Inventors: Chao-Jung Chen, Taoyuan (TW); Chih-Wei Lin, Taoyuan (TW); Jui-Chung Lee, Taoyuan (TW); Hui-Ying Suk, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 17/948,095

(22) Filed: Sep. 19, 2022

(65) Prior Publication Data

US 2024/0008212 A1 Jan. 4, 2024

Related U.S. Application Data

(60) Provisional application No. 63/356,829, filed on Jun. 29, 2022.

(51) Int. Cl.
*H05K 7/14* (2006.01)
*F16B 2/22* (2006.01)

(52) U.S. Cl.
CPC .............. *H05K 7/1491* (2013.01); *F16B 2/22* (2013.01)

(58) Field of Classification Search
CPC .......... H05K 7/1491; H05K 7/12; F16B 2/22; F16B 5/0657
See application file for complete search history.

(56) References Cited

U.S. PATENT DOCUMENTS

| | | | | |
|---|---|---|---|---|
| 2,523,185 A * | 9/1950 | Bedford, Jr. | ............. | H02G 3/32 248/74.2 |
| 3,778,537 A * | 12/1973 | Miller | ................. | H01Q 1/1228 24/339 |
| 5,829,722 A * | 11/1998 | Igarashi | ................ | H05K 7/142 248/222.12 |
| 6,216,987 B1 * | 4/2001 | Fukuo | ..................... | F16L 3/227 248/316.1 |
| 6,809,257 B2 * | 10/2004 | Shibuya | ............... | F16L 3/1083 174/72 A |
| 6,923,407 B2 * | 8/2005 | Takeuchi | ................ | H02G 3/32 248/68.1 |

* cited by examiner

*Primary Examiner* — Robert Sandy
(74) *Attorney, Agent, or Firm* — NIXON PEABODY LLP

(57) ABSTRACT

A clip for securing one or more cables associated with a computing device includes a baseplate, a first wall, and a second wall. The first wall and the second wall extend from the baseplate. The first wall has a first inward projection at a distal end thereof. The second wall has a second inward projection at a distal end thereof. The first wall is generally parallel to the second wall. The first wall and the second wall are spaced apart from each other by an interior space configured to receive the one or more cables. The first inward projection and the second inward projection aid in preventing the one or more cables from moving outside of the interior space.

16 Claims, 12 Drawing Sheets

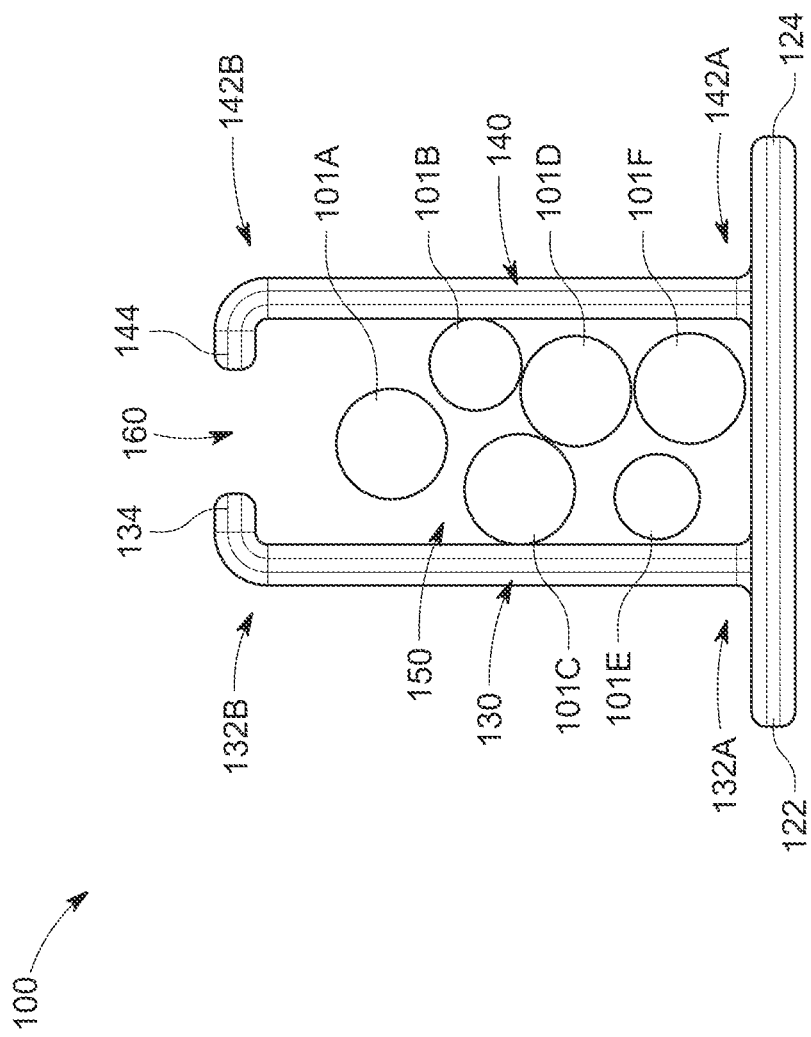

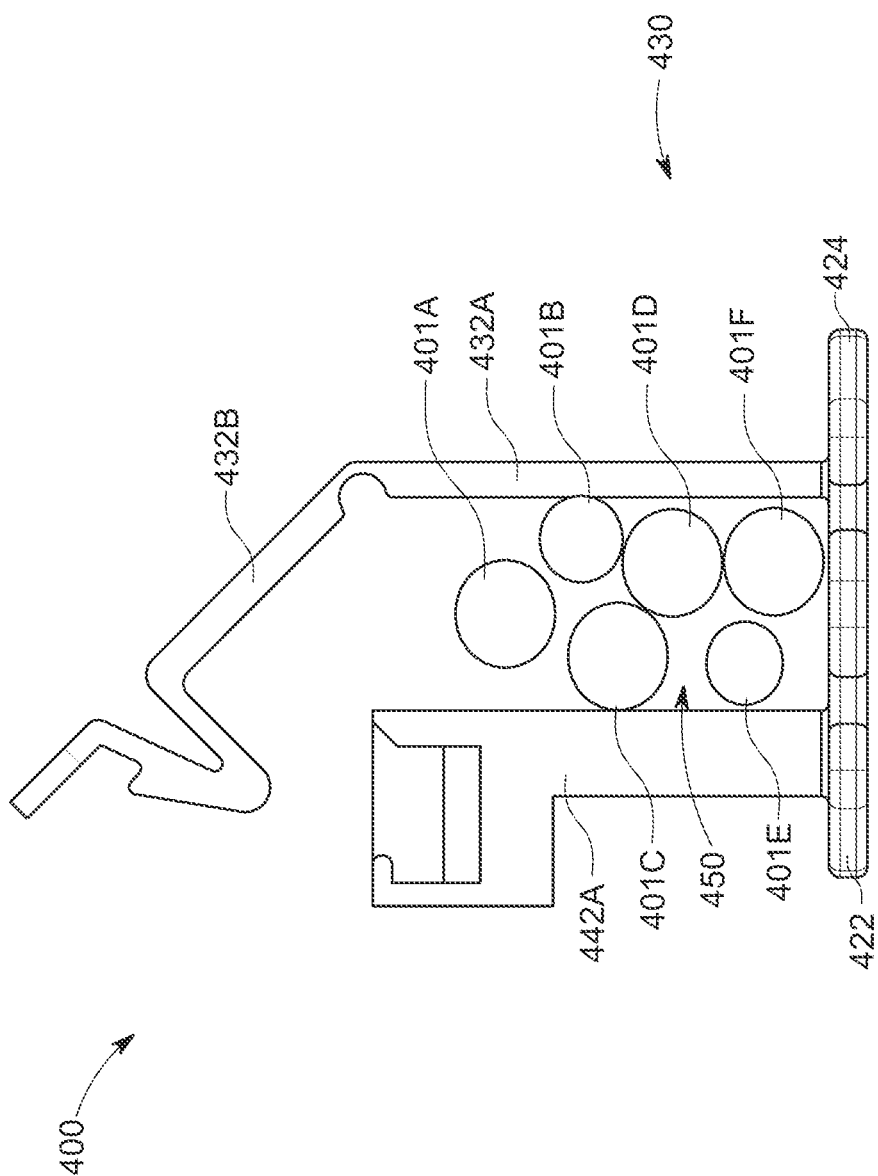

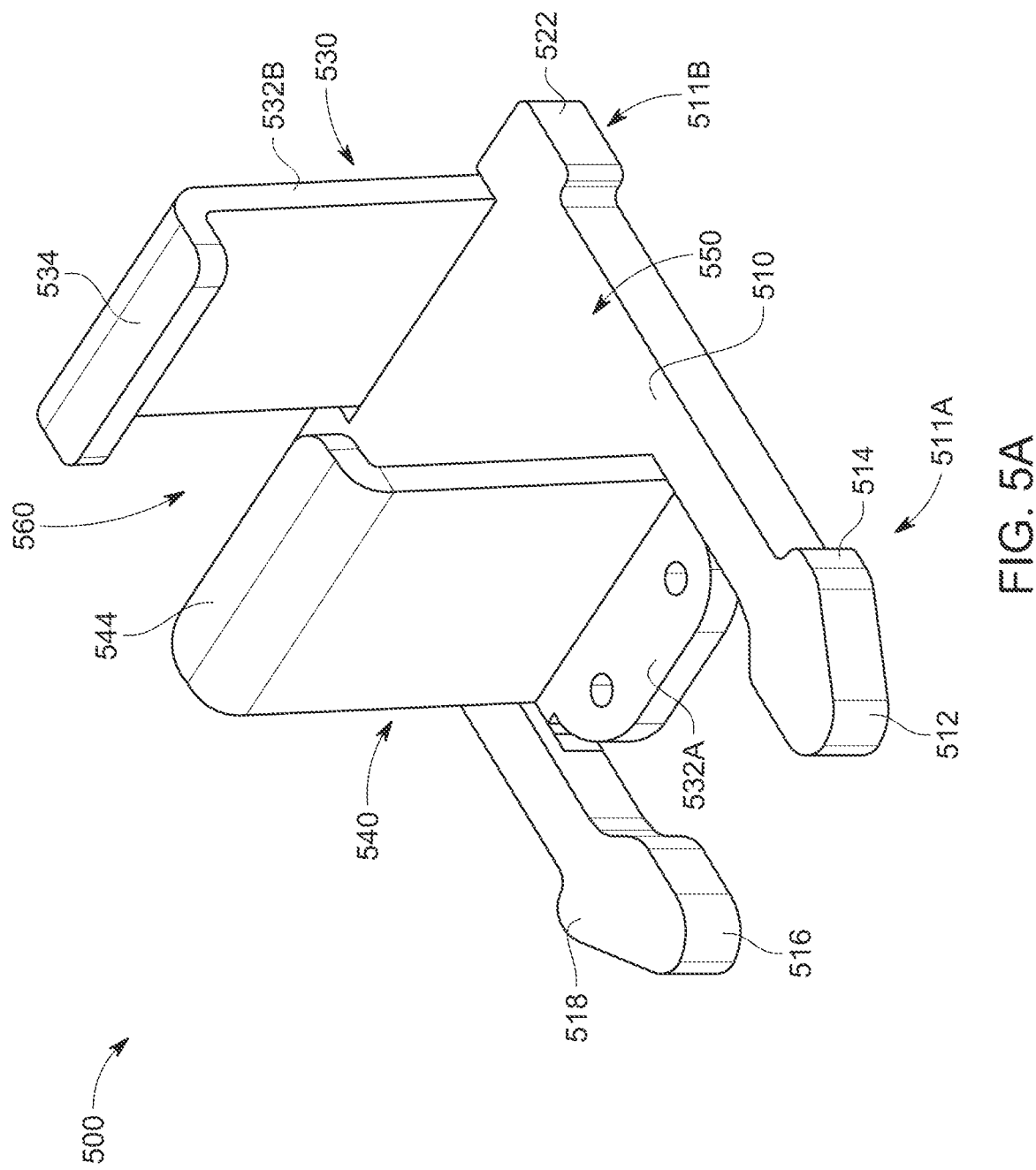

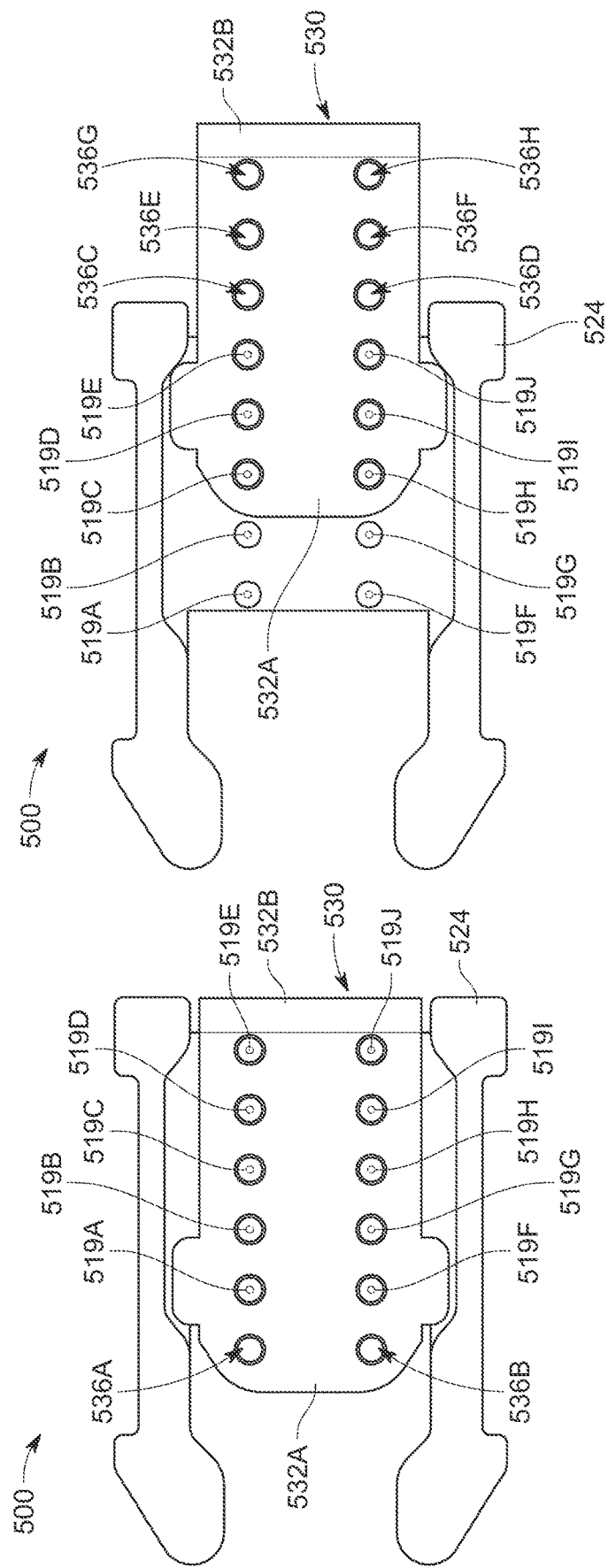

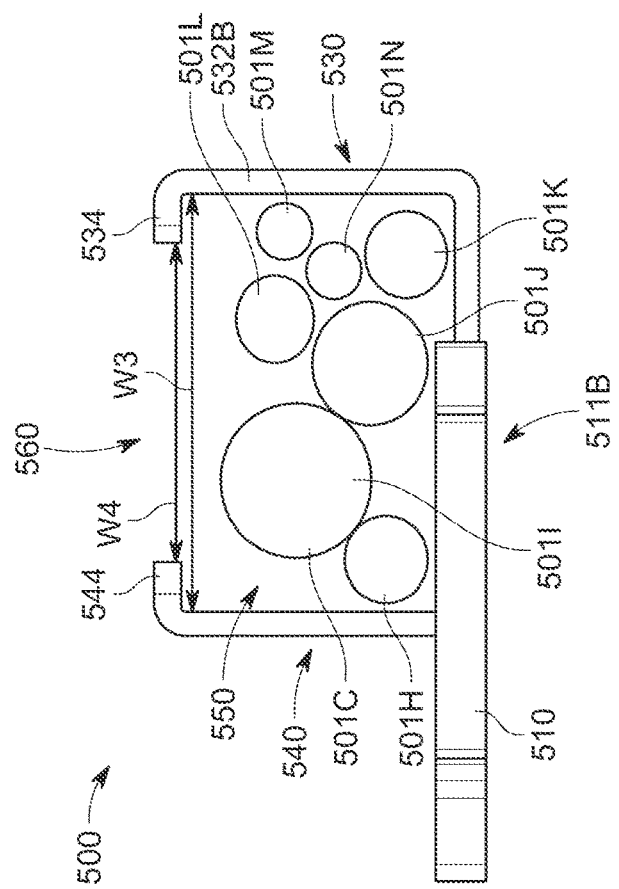
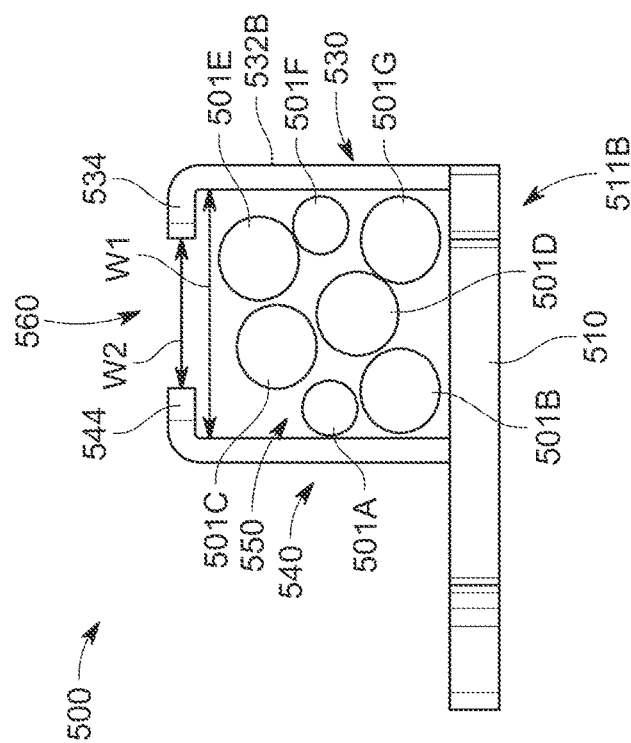
FIG. 5E
FIG. 5D

CABLE CLIP

CROSS-REFERENCE TO RELATED APPLICATIONS

This application claims priority from and the benefit of U.S. Provisional Patent Application Ser. No. 63/356,829, filed on Jun. 29, 2022, titled "Non-Adhesion Adjustable Cable-Clip," which is hereby incorporated by reference herein in its entirety.

FIELD OF THE INVENTION

The present invention relates generally to cable clips, and more specifically, to cable clips for securing cables used in a computing device.

BACKGROUND OF THE INVENTION

Servers are employed in large numbers for high demand applications such as network based systems or data centers. The emergence of the cloud for computing applications has increased the demand for data centers and other heavy operational demands. Data centers have numerous servers that store data and run applications accessed by remotely connected computer device users. A typical data center has physical chassis structures with attendant power and communication connections. Each rack may hold multiple computing servers and storage servers.

Generally, computing devices (such as servers) and their surrounding environments include a large number of cables. Proper routing and securing of these cables is important to ensure that the cables are not damaged, and do not inadvertently become disconnected. However, it can be difficult to properly secure such cables within a computing device and/or in the surrounding environment, due to such factors as heat, space constraints, etc. Thus, there is a need for improved clips for securing cables.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

In a first implementation, a clip for securing one or more cables associated with a computing device includes a baseplate, a first wall, and a second wall. The first wall and the second wall extend from the baseplate. The first wall has a first inward projection at a distal end thereof. The second wall has a second inward projection at a distal end thereof. The first wall is generally parallel to the second wall. The first wall and the second wall are spaced apart from each other by an interior space configured to receive the one or more cables. The first inward projection and the second inward projection aid in preventing the one or more cables from moving outside of the interior space.

In some aspects of the first implementation, a gap is defined between the first inward projection and the second inward projection. A width of the gap between the first inward projection and the second inward projection is less than a width of the interior space.

In some aspects of the first implementation, the first wall is movably coupled to the baseplate such that the first wall is movable relative to the baseplate between at least a first position and a second position.

In some aspects of the first implementation, when the first wall moves between the first position and the second position, the first wall moves toward or away from the second wall, such that a width of the interior space is adjustable.

In some aspects of the first implementation, the first wall includes a first portion coupled to an underside of the baseplate, and a second portion extending from the first portion. The second portion is generally parallel to the second wall.

In some aspects of the first implementation, the underside of the baseplate includes at least one boss extending therefrom, and the first portion of the first wall includes at least a first aperture and a second aperture defined therein. The at least one boss is configured to mate with the first aperture when the first wall is in the first position, and with the second aperture when the first wall is in the second position.

In a second implementation, a clip for securing one or more cables associated with a computing device comprises a baseplate, a first wall, and a second wall. The first wall and the second wall extend from the baseplate. The first wall has a stationary portion coupled to the baseplate and a movable portion coupled to the stationary portion. The stationary portion is movable relative to the stationary portion between at least a closed position and an open position. The first wall and the second wall are spaced apart from each other by an interior space configured to receive the one or more cables. The second wall is configured to be coupled to the first wall when the stationary portion is in the closed position and not when the stationary portion is in the open position.

In some aspects of the second implementation, when the movable portion of the first wall is in the closed position, the interior space is bound on at least four sides by the baseplate, the stationary portion of the first wall, the movable portion of the first wall, and the second wall.

In some aspects of the second implementation, when the movable portion of the first wall is in the closed position, the movable portion of the first wall is (i) generally parallel to the baseplate, and (ii) generally perpendicular to (a) the stationary portion of the first wall and (b) the second wall.

In some aspects of the second implementation, the movable portion of the first wall includes a projection extending therefrom, and the second wall includes a cavity defined at the distal end thereof. The cavity is sized to receive the projection to secure the movable portion of the first wall in the closed position.

In some aspects of the second implementation, the distal end of the second wall includes an overhanging ledge that forms a side of the cavity, and the projection includes a shoulder. In response to the cavity receiving the projection of the movable portion, the shoulder is positioned between the overhanging ledge and a bottom floor of the cavity, such that the projection is secured within the cavity.

In a third implementation, a clip for securing one or more cables associated with a computing device comprises a baseplate, a first wall, a second wall, a first resilient finger, and a second resilient finger. The first wall and the second wall extend from the baseplate. The second wall is generally parallel to the first wall. The first wall and the second wall are spaced apart by an interior space configured to receive the one or more cables. The first resilient finger and the second resilient finger extend from a first end of the baseplate. The second resilient finger is generally parallel to the first resilient finger. The first resilient finger and the second resilient finger are generally perpendicular to the first wall and the second wall. The first resilient finger and the second resilient finger aid in coupling the baseplate to an attachment point.

In some aspects of the third implementation, the attachment point is an attachment plate that includes a first sidewall and a second sidewall defining a slot therebetween. At least a portion of the baseplate is configured to be inserted into the slot between the first sidewall and the second sidewall to couple the clip to the attachment plate.

In some aspects of the third implementation, the first resilient finger includes a first shoulder portion extending outward from the first resilient finger in a first lateral direction.

In some aspects of the third implementation, the second resilient finger includes a second shoulder portion extending outward from the second resilient finger in a second lateral direction that is parallel to and opposite from the first lateral direction.

In some aspects of the third implementation, the baseplate includes a third shoulder portion extending laterally outward from a second end of the baseplate in the first lateral direction.

In some aspects of the third implementation, the baseplate includes a fourth shoulder portion extending laterally outward from the second end of the baseplate in the second lateral direction.

In some aspects of the third implementation, the first resilient finger and the second resilient finger are each movable between a respective first position and a respective second position.

In some aspects of the third implementation, when at least the portion of the baseplate is inserted into the slot and the first resilient finger and the second resilient finger are in their respective first positions, the first sidewall is positioned between the first shoulder portion and the third shoulder portion.

In some aspects of the third implementation, when at least the portion of the baseplate is inserted into the slot and the first resilient finger and the second resilient finger are in their respective first positions, the second sidewall is positioned between the second shoulder portion and the fourth shoulder portion, to thereby prevent the baseplate from being removed from the slot.

In some aspects of the third implementation, when the first resilient finger and the second resilient finger are in their respective second positions, the first sidewall is not positioned between the first shoulder portion.

In some aspects of the third implementation, when the first resilient finger and the second resilient finger are in their respective second positions, the second shoulder portion and (ii) the second sidewall is not positioned between the third shoulder portion and the fourth shoulder portion, to thereby allow the baseplate to be removed from the slot.

In some aspects of the third implementation, the attachment plate is located within a housing of the computing device.

In some aspects of the third implementation, the first resilient finger and the second resilient finger move toward or away from each other when moving from the respective first positions to the respective second positions.

In some aspects of the third implementation, the first resilient finger and the second resilient finger are both biased toward the respective first positions.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

FIG. 1B is an end view of the clip of FIG. 1A containing one or more cables therein, according to certain aspects of the present disclosure.

FIG. 4B is an end view of the clip of FIG. 4A containing one or more cables therein with a wall in an open position, according to certain aspects of the present disclosure.

FIG. 5A is a perspective view of a fourth implementation of a clip for securing one or more cables, according to certain aspects of the present disclosure.

FIG. 5B is an underside view of the clip of FIG. 5A with a wall in a first position, according to certain aspects of the present disclosure.

FIG. 5C is an underside view of the clip of FIG. 5A with a wall in a second position, according to certain aspects of the present disclosure.

FIG. 5D is a side view of the clip of FIG. 5A containing one or more cables therein when the wall is in the first position, according to certain aspects of the present disclosure.

FIG. 5E is a side view of the clip of FIG. 5A containing one or more cables therein when the wall is in the second position, according to certain aspects of the present disclosure.

DETAILED DESCRIPTION

Figure 1A:
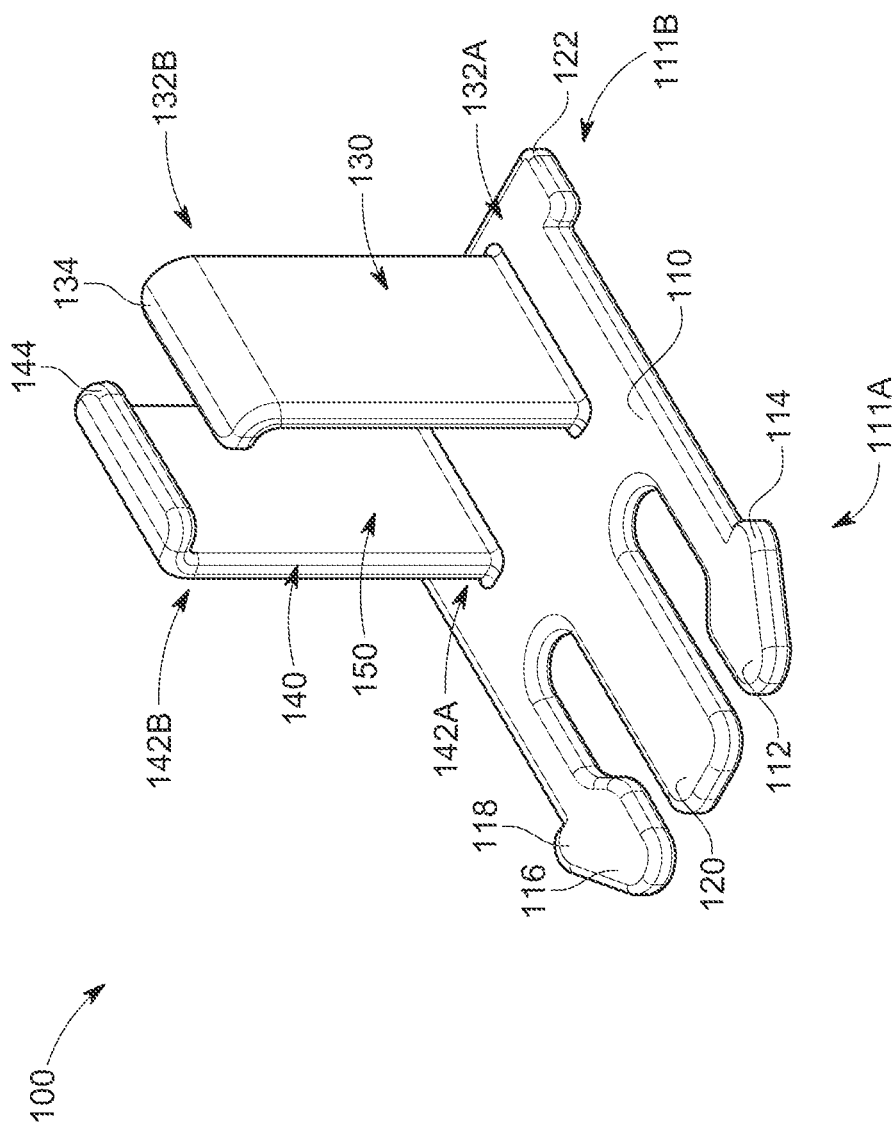
FIG. 1A is a perspective view of a first implementation of a clip for securing one or more cables, according to certain aspects of the present disclosure.

The examples disclosed herein relate to a cable clip that is used to secure one or more cables of a computing device. The cable clip can be coupled to the inside or the outside of the housing of the computing device. The cable clip can also be coupled to some other component or structure inside of or outside of the housing of the computing device. Different implementations of the cable clip include different mechanisms for holding and securing the one or more cables.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5%" of a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

FIG. 1A illustrates a first implementation of a cable clip according to aspects of the present disclosure. FIG. 1A shows a clip 100 that includes a baseplate 110, a first wall 130 extending from the baseplate 110, and a second wall 140 extending from the baseplate 110. The first wall 130 and the second wall 140 generally extend in the same direction from the baseplate 110. The first wall 130 and the second wall 140 are spaced apart from each other such that an interior space 150 is formed between the first wall 130 and the second wall 140. The interior space 150 is bound on two sides by the first wall 130 and the second wall 140, and on an additional side by the baseplate 110. As is discussed in more detail herein, the interior space 150 can receive one or more cables therein.

A proximal end 132A of the first wall 130 and a proximal end 142A of the second wall 140 are both coupled to the baseplate 110. In some implementations, the proximal ends 132A and 142A are integrally formed with the baseplate 110, such that the first wall 130 and the second wall 140 are permanently attached to the baseplate 110. In other implementations, the first wall 130 and the second wall 140 are formed separately from the baseplate 110, but are then coupled to the baseplate 110 such that the first wall 130 and the second wall 140 are permanently attached to the baseplate 110. In further implementations, the first wall 130 and the second wall 140 are removably coupled to the baseplate 110.

A distal end 132B of the first wall 130 is spaced apart from the baseplate 110, and includes an inward projection 134. Similarly, a distal end 142B of the second wall 140 is spaced apart from the baseplate 110, and includes an inward projection 144. The inward projection 134 extends laterally from the distal end 132B of the first wall 130, toward the second wall 140. The inward projection 144 extends laterally from the distal end 132B of the first wall 130, toward the second wall 140. A gap 160 is formed between the inward projection 134 of the first wall 130, and the inward projection 144 of the second wall 140. The width of the gap 160 (e.g., the distance between the end of the inward projection 134 and the inward projection 144) is generally smaller than the width of the interior space 150 (e.g., the distance between the first wall 130 and the second wall 140).

The baseplate 110 includes a first resilient finger 112, a second resilient finger 116, and a center projection 120 that extend from a first end 111A of the baseplate 110. The center projection 120 is positioned between the first resilient finger 112 and the second resilient finger 116. The first resilient finger 112, the second resilient finger 116, and the center projection 120 all extend from the baseplate 110 in a lateral direction that is generally perpendicular the direction at which the first wall 130 and the second wall 140 extend from the baseplate 110. Thus, the first resilient finger 112, the second resilient finger 116, and the center projection 120 are all generally coplanar with the baseplate 110.

The first resilient finger 112 and the second resilient finger 116 are generally made from a resilient material and are biased toward respective original positions. The first resilient finger 112 and the second resilient finger 116 are thus able to be moved by an external force, and then return to their original positions. The first resilient finger 112 and the second resilient finger 116 can be moved toward each other (e.g., toward the center projection 120) and/or away from each other (e.g., away from the center projection 120), such that the distance between the first resilient finger 112 and the second resilient finger 128 changes. In some implementations (including the illustration implementation), the original positions of the first resilient finger 112 and the second resilient finger 116 are the positions where the first resilient finger 112 and the second resilient finger 116 are generally parallel to each other, and to the center projection 120. In other implementations, the first resilient finger 112 and the second resilient finger 116 have different original positions. As is discussed in more detail herein, the first resilient finger 112 and the second resilient finger 116 can be moved between a first position and a second position to facilitate the placement of the clip 100 in a desired location.

The first resilient finger 112 and the second resilient finger 116 include shoulder portions that can be used to secure the clip 100 to a computing device, as is discussed in more detail herein. The first resilient finger 112 includes a first shoulder portion 114 that extends laterally outward from the first resilient finger 112 in a first lateral direction (e.g., a direction that is generally coplanar with the baseplate 110 and perpendicular to (i) the direction in which the first resilient finger 112 and the second resilient finger 116 extend, and (ii) the direction in which the first wall 130 and the second wall 140 extend). The second resilient finger 116 includes a second shoulder portion 118 that extends laterally outward from the second resilient finger 116 in a second lateral direction that is opposite the first lateral direction.

The baseplate 110 include corresponding shoulder portions that are disposed at a second end 111B of the baseplate 110. A third shoulder portion 122 extends laterally outward from the baseplate 110 in the first lateral direction. A fourth shoulder portion 124 (visible in FIG. 1B) extends laterally outward from the baseplate 110 in the second lateral direction. Thus, the first shoulder portion 114 and the third shoulder portion 122 are aligned along the side of the baseplate 110 closest to the first wall 130. The second shoulder portion 118 and the fourth shoulder portion 124 are aligned along the side of the baseplate 110 closest to the second wall 140.

FIG. 1B shows the clip 100 of FIG. 1A being used to hold a plurality of cables 101A-101F that are located within the housing of a computing device, and/or external to the housing of the computing device. FIG. 1B is an end view of the back of the clip 100, and thus both the third shoulder portion 122 and the fourth shoulder portion 124 are visible. As shown, a portion of the cables 101A-101F are positioned within the interior space 150 that is defined between the first wall 130 and the second wall 140. The first wall 130 and the second wall 140 are thus used to hold and secure the cables 101A-101F. As can be seen in FIG. 1B, the width of the gap 160 that is formed between the inward projection 134 of the first wall 130 and the inward projection 144 of the second wall 140 is less than the width of the interior space 150. The reduced width of the gap 160 relative to the width of the interior space 150—as a result of the inward projection 134 and the inward projection 144—aids in preventing one or more of the cables 101A-101F from being inadvertently removed from the interior space 150 or otherwise moving outside of the interior space 150.

Generally, the first wall 130 and the second wall 140 will be made of a resilient material (which may be the same as or similar to the material forming the first resilient finger 112 and the second resilient finger 116). Thus, the distal end 132B of the first wall 130 can flex relative to the proximal end 132A, and the distal end 142B of the second wall 140 can flex relative to the proximal end 142A. When the distal ends 132B and 142B flex away from each other, the width of the gap 160 is increased, allowing the cables 101A-101F to be inserted into and/or removed from the interior space 150.

Figure 2A:
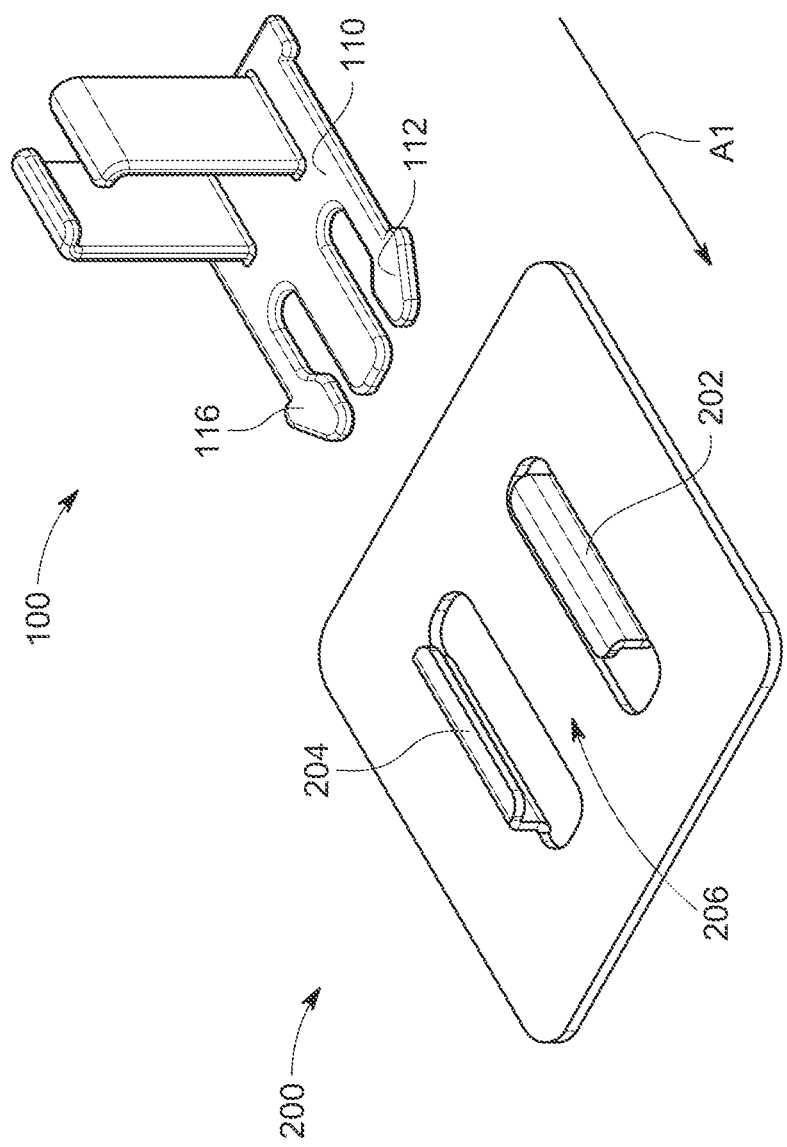
FIG. 2A is a perspective view of the clip of FIG. 1A prior to the clip being coupled to an attachment plate, according to certain aspects of the present disclosure.
Figure 2B:
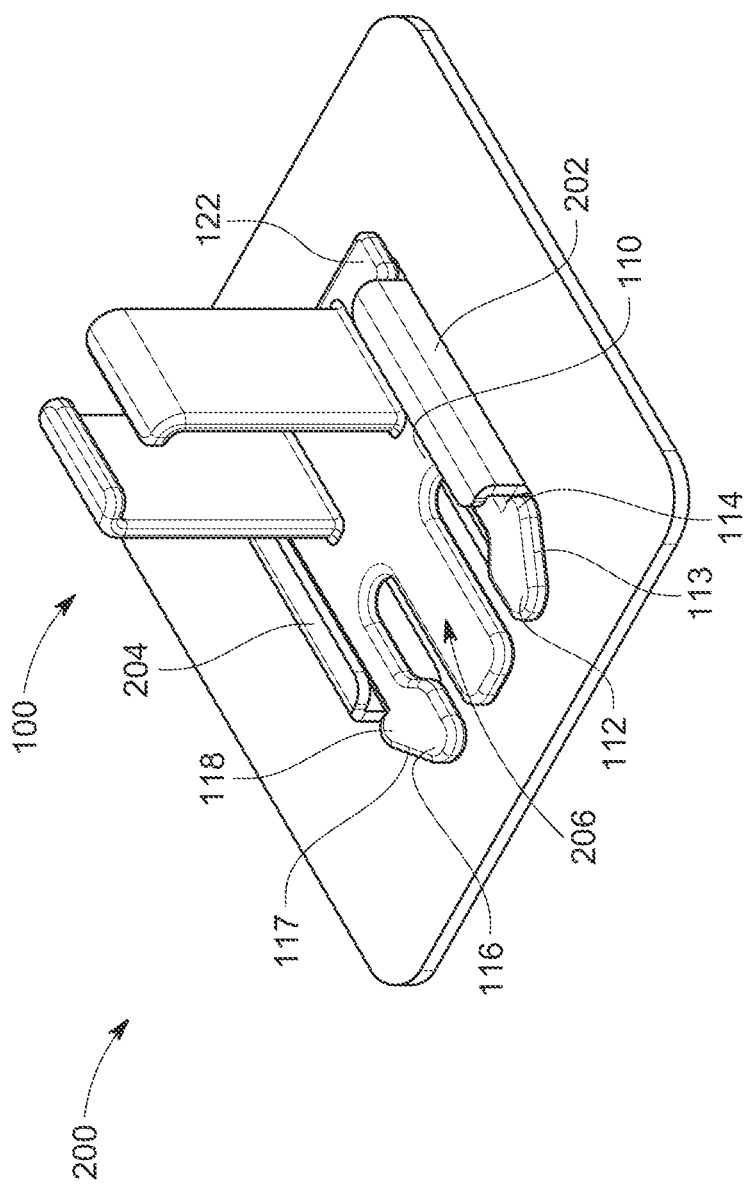
FIG. 2B is a perspective view of the clip of FIG. 1A after being coupled to the attachment plate, according to certain aspects of the present disclosure.
Figure 2C:
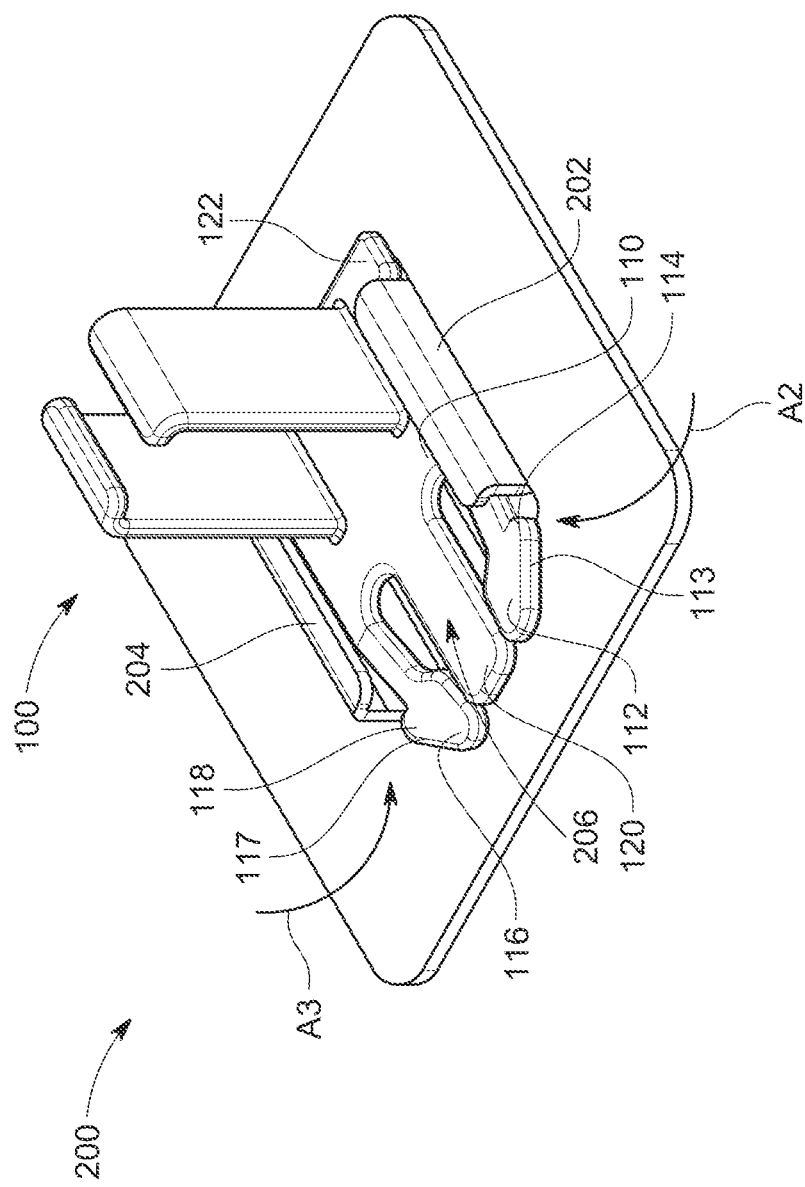
FIG. 2C is a perspective view of the clip of FIG. 1A being unlocked from the attachment plate, according to certain aspects of the present disclosure.

FIGS. 2A-2C show how the clip 100 can be installed into and uninstalled from a computing device. FIG. 2A shows the clip 100 and an attachment plate 200 to which the clip 100 can be coupled. The attachment plate 200 includes a first sidewall 202 and a second sidewall 204. The first sidewall 202 and the second sidewall 204 each extend away from the surface of the attachment plate 200 then toward each other. A slot 206 is defined between the first sidewall 202, the second sidewall 204, and the surface of the attachment plate 200. A portion of the baseplate 110 of the clip 100 (including at least a portion of the first resilient finger 112 and at least a portion of the second resilient finger 116) can be inserted into the slot 206 in the attachment plate 200 in order to secure the clip 100 to the attachment plate 200. Prior to the insertion of the portion of the baseplate 110 into the slot 206, the first resilient finger 112 and the second resilient finger 116 are in a first position as shown in FIG. 2A. In the first position, the first resilient finger 112 and the second resilient finger 116 extend from the baseplate 110 parallel to each other.

In some implementations, the attachment plate 200 is located within the housing of a computing device (e.g., a server). The attachment plate 200 could be integrally formed with the housing, or could be formed separately and then attached to the housing (e.g., via screws, pins, clips, etc.). In other implementations, the attachment plate 200 is located on the outside of the housing of the computing device, and could be integrally formed with the housing or formed separately and then attached to the housing. In still other implementations, the attachment plate 200 could be located separate from the housing of the computing device. For example, if the computing device is a rackmount server, the attachment plate 200 could be located on the rack itself, instead of inside or on the housing of the computing device. In still other implementations, the first sidewall 202 and the second sidewall 204 are not part of the attachment plate 200, but instead are themselves formed with or coupled to the location where the clip 100 is to be used. For example, the sidewalls 202 and 204 can be arise directly from the housing of the computing device (inside or outside of the housing, and either integrally formed or separately formed), instead of arising from the attachment plate 200 that is then coupled to the housing.

To couple the clip 100 to the attachment plate 200, the clip 100 is moved in the direction of arrow A1 toward the attachment plate 200, and inserting at least a portion of the baseplate 110 of the clip 100 into the slot 206 formed by the first sidewall 202 and the second sidewall 204. FIG. 2B shows the clip 100 coupled to the attachment plate 200. Once the portion of the baseplate 110 is fully inserted into the slot 206, the end of the first resilient finger 112 will extend past the end of the first sidewall 202, and the end of the second resilient finger 116 will extend past the end of the second sidewall 204.

As can be seen in FIG. 2B, the clip 100 is locked into place by the shoulder portions 114, 118, 122, and 124 (not visible in FIG. 2B). The first shoulder portion 114 and the third shoulder portion 122 are disposed on either side of the first sidewall 202 of the attachment plate 200, such that the first sidewall 202 is positioned between the first shoulder portion 114 and the third shoulder portion 122. Similarly, the second shoulder portion 118 and the fourth shoulder portion 124 are disposed on either side of the second sidewall 204 of the attachment plate 200, such that the second sidewall 204 is positioned between the second shoulder portion 118 and the fourth shoulder portion 124. The alignment of the shoulder portions 114, 118, 122, and 124 and their corresponding sidewalls 202 and 204 prevents the baseplate 110 from being removed from the slot 206 when the first resilient finger 112 and the second resilient finger 116 are in their first positions. Thus, the first resilient finger 112 and the second resilient finger 116 aid in coupling the baseplate 110 to the attachment plate 200.

FIG. 2C shows the clip 100 when the first resilient finger 112 and the second resilient finger 116 are moved from their first positions to their second positions. In their second positions, the first resilient finger 112 and the second resilient finger 116 are moved closer toward each other, and toward the center projection 120. The center projection 120 can be used as a stop, so that first resilient finger 112 and the second resilient finger 116 cannot be pushed inward any further (which could cause the first resilient finger 112 and the second resilient finger 116 to deform).

Generally, a user will manually move the first resilient finger 112 and the second resilient finger 116 to their second positions by pressing inward on the first resilient finger 112 in the direction of arrow A2, and inward on the second resilient finger 116 in the direction of arrow A3. However, in some implementations, other mechanisms could be used to apply force to the first resilient finger 112 and the second resilient finger 116. For example, an automated mechanism could be used that presses inward on the first resilient finger 112 and the second resilient finger 116 in response to the user pressing a button, entering a command, or otherwise providing input that indicates that the first resilient finger 112 and the second resilient finger 116 need to be moved to their second positions.

Once the first resilient finger 112 is moved to its second position, the first sidewall 202 is no longer positioned between the first shoulder portion 114 and the third shoulder portion 122. Similarly, once the second resilient finger 116 is moved to its second position, the second sidewall 204 is no longer positioned between the second shoulder portion 118 and the fourth shoulder portion 124. Instead, the first shoulder portion 114 and the second shoulder portion 118 are pushed inward towards each other, such that the first sidewall 202 and the second sidewall 204 no longer prevent the baseplate 110 from being slide out of the slot 206. Thus, the clip 100 can be decoupled from the attachment plate 200 once the first resilient finger 112 and the second resilient finger 116 are moved to their second positions. The first resilient finger 112 and the second resilient finger 116 are biased towards their respective first positions, and thus will generally return to their respective first positions once the baseplate 110 is fully removed from the slot 206.

The alignment of the shoulder portions 114, 118, 122, and 124 and the sidewalls 202 and 204 would generally also prevent the baseplate 110 from initially being inserted into the slot 206. However, the first resilient finger 112 and the second resilient finger 116 can be moved to their second positions (e.g., inward toward each other and the center projection 120) before or during insertion of the portion of the baseplate 110 into the slot 206. As shown in FIG. 2C, the first resilient finger 112 has an angled surface 113, and the second resilient finger 116 has an angled surface 117. When the baseplate 110 is initially inserted into the slot 206, the angled surface 113 of the first resilient finger 112 will contact the first sidewall 202, and the angled surface 117 of the second resilient finger 116 will contact the second sidewall 204. This contact will cause the first resilient finger 112 and the second resilient finger 116 to move inward, so that the first sidewall 202 and the second sidewall 204 no longer prevent the baseplate 110 from being inserted into the slot 206. Once the baseplate 110 is fully inserted and the shoulder portions 114 and 118 pass the ends of the corresponding sidewalls 202 and 204, the first resilient finger 112 and the second resilient finger 116 will return to their first positions, so that the clip 100 is locked into place.

Figure 3:
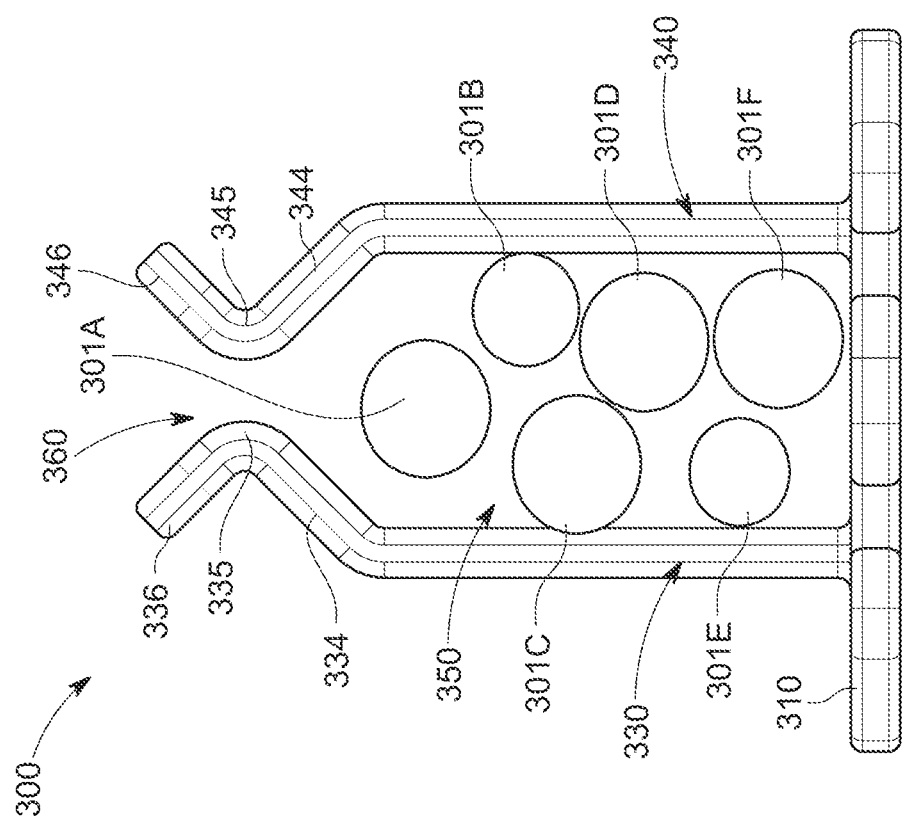
FIG. 3 is an end view of a second implementation of a clip for securing one or more cables, according to certain aspects of the present disclosure.

Other implementations of a cable clip can also be used with the attachment plate 200 in generally the same fashion. FIG. 3 shows a clip 300, which is a modified version of the clip 100. The clip 300 includes a baseplate 310, a first wall 330, and a second wall 340. An interior space 350 is defined between the first wall 330 and the second wall 340, which holds cables 301A-301F. The clip 300 can also include a pair of resilient fingers (similar to the first resilient finger 112 and the second resilient finger 116 of the clip 100) and one or more shoulder portions (similar to the shoulder portions 114, 118, 122, and/or 124 of the clip 100) that are used to secure the clip 300 to the attachment plate 200. However, these features are not shown in FIG. 3.

The first wall 330 includes an inward projection 334 and an outward projection 336 that meet at terminus 335. Similarly, the second wall 340 includes an inward projection 344 and an outward projection 346 that meet at a terminus 345. An opening 360 is defined between the termini 335 and 345, which is generally smaller than the width of the interior space 350. The inward projection 334, the outward project 336, the inward projection 344, and the outward projection 346 are all angled upwards away from the baseplate 310. If one of the cables 301A-301F is larger than the opening 360, as this cable is removed from the interior space 350 through the opening 360, the cable can slide along the angled surfaces of the inward projections 334 and 344 and force the termini 335 and 345 apart. This enlarges the opening 360 and allows the cable to pass through the opening 360. Similarly, if that cable is inserted into the interior space 350 through the opening 360, the cable can slide along the angled surfaces of the outward projections 336 and 346 and force the termini 335 and 345 apart. This enlarges the opening 360 and allows the cable to pass through the opening 360.

Figure 4A:
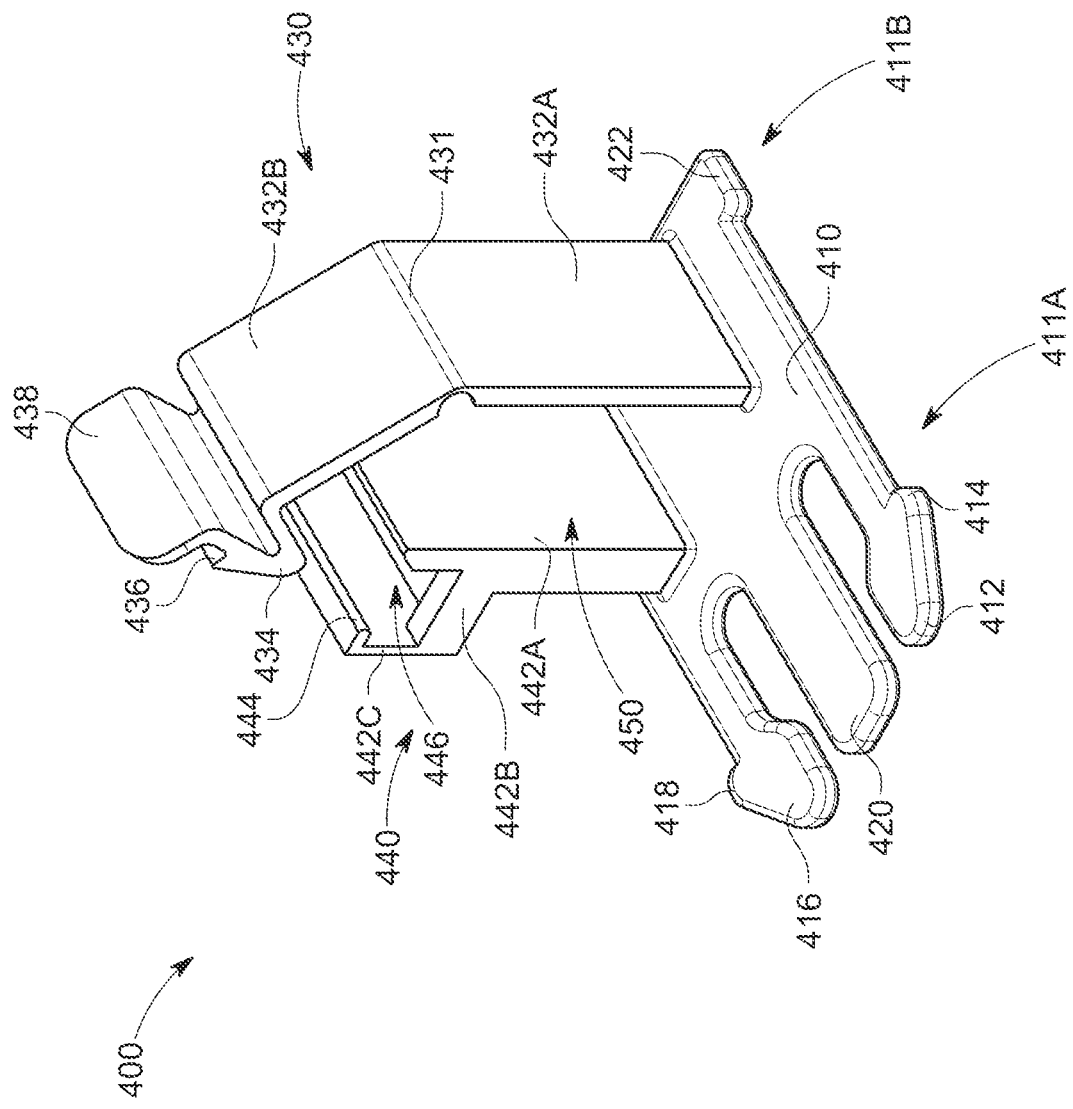
FIG. 4A is a perspective view of a third implementation of a clip for securing one or more cables, according to certain aspects of the present disclosure.

FIG. 4A shows a clip 400 which can be used to secure one or more cables. Clip 400 is similar to clip 100 and clip 300, and includes a baseplate 410, a first resilient finger 412, a second resilient finger 416, a center projection 420, a first wall 430, and a second wall 440. An interior space 450 is defined at least by the baseplate 410, the first wall 430, and the second wall 440. The first resilient finger 412, the second resilient finger 416, and the center projection 420 all extend from a first end 411A of the baseplate 410. The first wall 430 and the second wall 440 extend upward adjacent to the second end 411B of the baseplate 410. The first resilient finger 412 includes a first shoulder portion 414 extending laterally from the first resilient finger 412, and the second resilient finger 416 includes a second shoulder portion 418 extending laterally from the second resilient finger 416. Further, the baseplate 410 includes a third shoulder portion 422 and a fourth shoulder portion 424 (shown in FIGS. 4B and 4C). The first resilient finger 412, the second resilient finger 416, the center projection 420, and the shoulder portions 414, 418, 422, and 424 are all generally the same as or similar to their corresponding components in clip 100 and clip 300, and operate in generally the same manner or a similar manner to couple the clip 400 to the attachment plate 200.

The first wall 430 includes a stationary portion 432A and a movable portion 432B. The stationary portion 432A is coupled or otherwise attached to the baseplate 410 (e.g., integrally formed with the baseplate 410, separately formed and then attached to the baseplate 410, etc.), and the movable portion 432B is coupled to the stationary portion 432A. In the illustrated implementation, the stationary portion 432A and the movable portion 432B are coupled via a living hinge 431 (e.g., a hinge formed from the stationary portion 432A and the movable portion 432B). In other implementations, the stationary portion 432A and the movable portion 432B can be coupled via other types of hinges, or other types of movable connections (e.g., a pin inserted through corresponding apertures in the stationary portion 432A and the movable portion 432B). The movable portion 432B is configured to move between at least an open position and a closed position. In FIG. 4A, the movable portion 432B is in the open position.

A distal end of the movable portion 432B includes a projection 434 and a tab 438. The projection 434 is a generally V-shaped structure that extends away from and back towards the movable portion 432B. The projection 434 further includes a shoulder 436 that is used to secure the first wall 430 to the second wall 440, as discussed in more detail herein. The tab 438 is coupled to the projection 434 and forms the distal tip of the movable portion 432B.

The second wall 440 is formed from a first portion 442A, a second portion 442B, and a third portion 442C. The first portion 442A is generally perpendicular to the baseplate 410, and is similar to second wall 140 of the clip 100. The second portion 442B extends generally perpendicularly from the first portion 442A and is parallel to the baseplate 410. The third portion 442C extends generally perpendicularly from the second portion 442B, and is parallel to the first portion 442A. The third portion 442C includes an overhanging ledge 444 running along the edge of the third portion 442C that is closest to the first portion 442A.

As can be seen in FIG. 4A, the second portion 442B extends outward from the first portion 442A at a point that is lower than a top end of the first portion 442A. Further, a top end of the third portion 442C is generally aligned with the top end of the first portion 442A. The first portion 442A, the second portion 442B, and the third portion 442C thus define a cavity 446 that is sized to receive at least part of the projection 434 of the first wall 430. The overhanging ledge 444 of the third portion 442C (part of the second wall 440) is configured to mate with the shoulder 436 of the projection 434 (part of the first wall 430), in order to secure the first wall 430 to the second wall 440.

FIG. 4B shows the clip 400 with cables 401A-401F positioned in the interior space 450, and the movable portion 432B of the first wall 430 in the open position. FIG. 4B is an end view of the back of the clip 400, and thus the third shoulder portion 422 and the fourth shoulder portion 424 are visible. When the movable portion 432B of the first wall 430 is in the open position, the interior space 450 is bounded on three sides by the baseplate 410, the stationary portion 432A of the first wall 430, and the first portion 442A of the second wall 440. Thus, the cables 401A-401F can easily be inserted into and removed from the interior space 450.

Figure 4C:
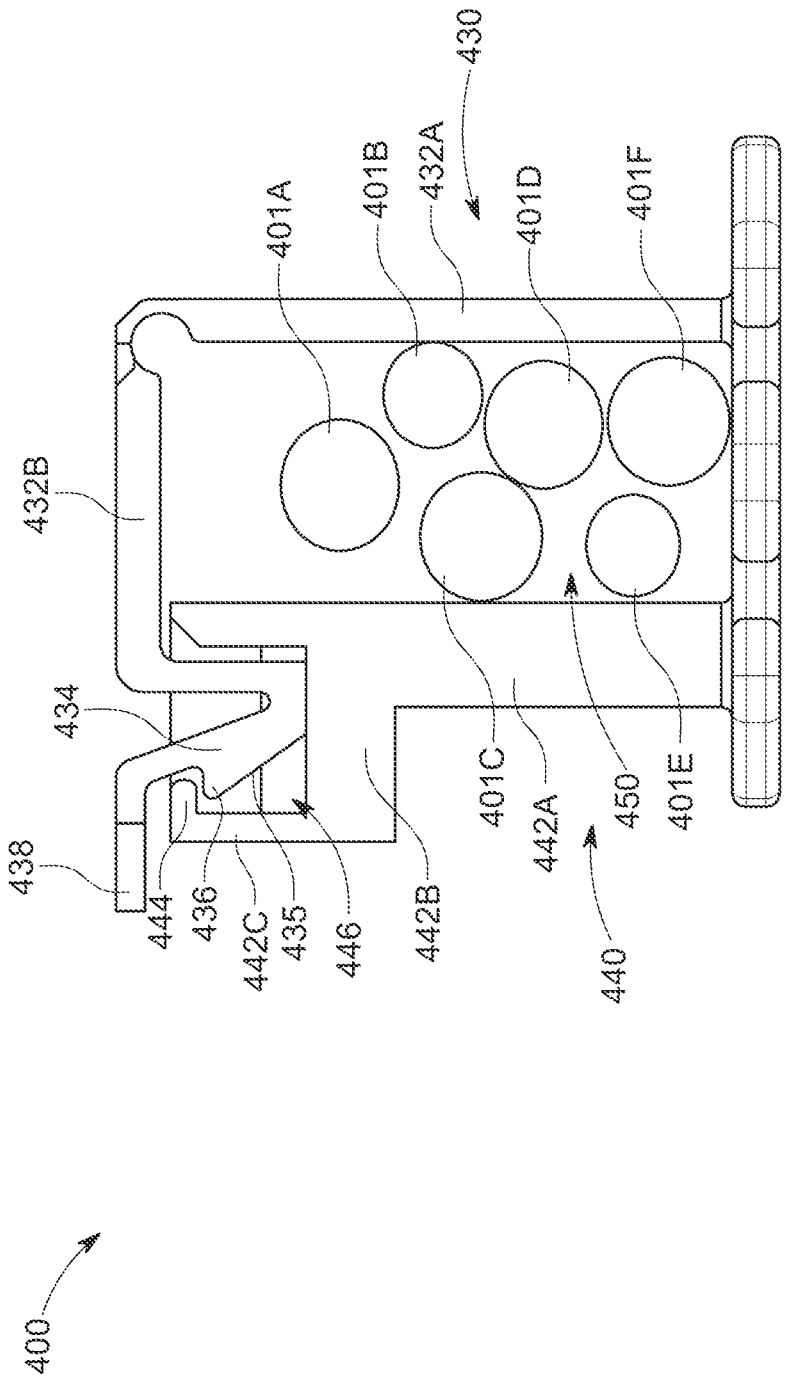
FIG. 4C is an end view of the clip of FIG. 4A containing the one or more cables therein with the wall in a closed position, according to certain aspects of the present disclosure.

FIG. 4C shows the clip 400 with the cables 401A-401F positioned in the interior space 450, and the movable portion 432B of the first wall 430 in the closed position. When the movable portion 432B is in the closed position, the movable portion 432B is generally parallel to the baseplate 410, and perpendicular to the stationary portion 432A. The interior space 450 is now bound on four sides by the baseplate 410, the stationary portion 432A of the first wall 430, the movable portion 432B of the first wall 430, and the first portion 442A of the second wall 440. Thus, the cables 401A-401F cannot be removed from the interior space 450 (and/or inserted into the interior space 450) when the movable portion 432B is in the closed position.

When the movable portion 432B is in the closed position, the V-shaped projection 434 is received within the cavity 446 formed at the end of the second wall 440. As is shown in FIG. 4C, the overhanging ledge 444 of the third portion 442C will be positioned between (i) the shoulder 436 of the projection 434, and (ii) the tab 438, when the projection 434 is received within the cavity 446. The shoulder 436 is thus positioned between (i) the overhanging ledge 444 and (ii) the bottom floor of the cavity 446 (which is formed from a top surface of the second portion 442B). This positioning aids in preventing the movable portion 432B from inadvertently moving from the closed position to the open position. To move the movable portion 432B to the open position, a user can press the tab 438 towards the stationary portion 432A of the first wall 430, so that the projection 434 compresses, and the shoulder 436 is no longer positioned in line with the overhanging ledge 444 of the third portion 442C. The projection 434 can be then removed from the cavity 446 as the movable portion 432B is moved to the open position.

In some implementations, the projection 434 resilient and is biased toward the uncompressed position shown in FIG. 4C. When the movable portion 432B of the first wall 430 is moved to the closed position, an angled surface 435 of the projection 434 will contact the overhanging ledge 444. This contact causes the projection 434 to compress, and the shoulder 436 to move out of the way of the overhanging ledge 444, so that the projection 434 can be fully inserted into the cavity 446. Once the shoulder 436 travels past the overhanging ledge 444, the projection 434 will return to its uncompressed position.

FIG. 5A shows a clip 500 which can be used to secure one or more cables. Clip 500 is similar to clips 100, 300, and 400, and includes a baseplate 510, a first resilient finger 512, a second resilient finger 516, a first wall 530, and a second wall 540. An interior space 550 is defined at least by the baseplate 510, the first wall 530, and the second wall 540. The first wall 530 extends upward adjacent to the second end 511B of the baseplate 510. As shown in FIG. 5A, the first wall 530 includes a first portion 532A that extends underneath the baseplate 510, and a second portion 532B that is coupled to the first portion 532A and resembles the first wall 130 of the clip 100. Thus, the first wall 530 is generally L-shaped. The first portion 532A of the first wall 530 is coupled to the underside of the baseplate 510, to thereby couple the first wall 530 to the baseplate 510. The second wall 540 extends upward adjacent to the first end 511A of the baseplate 510, near where the first resilient finger 112 and the second resilient finger 516 originate.

The first wall 530 includes an inward projection 534 that extends toward the second wall 540, and the second wall 540 includes an inward projection 544 that extends toward the first wall 530. A gap 560 is formed between the inward projection 534 of the first wall 530, and the inward projection 544 of the second wall 540. The width of the gap 560 (e.g., the distance between the end of the inward projection 534 and the inward projection 544) is generally smaller than the width of the interior space 550 (e.g., the distance between the first wall 530 and the second wall 540). Similar to the interior space 150 and the gap 160 of the clip 100, the reduced width of the gap 560 relative to the width of the interior space 550—as a result of the inward projection 534 and the inward projection 544—aids in preventing cables from being inadvertently removed from the interior space 550.

The first resilient finger 512 and the second resilient finger 516 all extend from a first end 511A of the baseplate 510. The first resilient finger 512 includes a first shoulder portion 514 extending laterally from the first resilient finger 512, and the second resilient finger 516 includes a second shoulder portion 518 extending laterally from the second resilient finger 516. Further, the baseplate 510 includes a third shoulder portion 522 and a fourth shoulder portion 524 (shown in FIGS. 5B and 5C). The first resilient finger 512, the second resilient finger 516, and the shoulder portions 514, 518, 522, and 524 are all generally the same as or similar to their corresponding components in clips 100, 300, and 400, and operate in generally the same manner or a similar manner to couple the clip 400 to the attachment plate 200. In the illustrated implementation, clip 500 does not include a center projection positioned between the first resilient finger 512 and the second resilient finger 516. However, other implementations of clip 500 could include the center projection. Similarly, while the illustrated implementations of clip 100 and clip 400 each include a center projection, other implementations of clip 100 and clip 400 could exclude the center projection. Similarly, clip 300 could include or exclude a center projection.

FIGS. 5B and 5C are underside views of the clip 500 that show the first wall 530 of the clip 500 moving a first position and a second position, in order to change the size of the interior space 550 to accommodate different numbers of cables. The fourth shoulder portion 524 is visible. The baseplate 510 includes a plurality of bosses 519A-519J that extending from the underside of the baseplate 510. The first portion 532A of the first wall 530 includes a plurality of aperture defined therethrough. The first wall 530 can be moved so that the bosses 519A-519J extend through different sets of the apertures defined in the first portion 532A.

In FIG. 5B, the first wall 530 is in the first position and none of the bosses 519A-519J extend through aperture 536A or aperture 536B, but do extend through the remaining apertures in the first portion 532A. In FIG. 5C, the first wall 530 has been moved to the second position. In the second position, bosses 519C, 519D, 519E, 519H, 519I, and 519J extend through corresponding apertures in the first portion 532A (including aperture 536A and aperture 536B, which were unfilled in the positioned of FIG. 5A). Bosses 519A, 519B, 519F, and 519G do not extend through any of the apertures in the first portion 532A, and apertures 536C-536H do not have any of the bosses extending therethrough.

In some implementations, the bosses of the baseplate 510 mate with the apertures of the first portion 532A of the first wall 530 via a snap fit or a friction fit. In these implementations, a diameter of each of the bosses will be slightly larger than a diameter of each of the apertures. When the first wall 530 is moved to the desired position, the first portion 532A can be pressed against the baseplate 510 to snap the bosses into the corresponding apertures. In other implementations, the clip 500 may include a bottom cover plate that attaches to the ends of the bosses that extend through the apertures. In further implementations, the first wall 530 may be attached to the baseplate 510 in a different manner.

Further, while FIGS. 5B and 5E show a specific arrangement that includes two rows of fives bosses and two rows of six apertures, any suitable arrangement of bosses and apertures could be used. For example, some implementations of the clip 500 may include an equal number of bosses and apertures arrange in any number of rows. In other implementations, clip 500 may include a single aperture and a plurality of bosses. In further implementations, clip 500 may include bosses and apertures arranged in such a manner so as to allow the first wall 530 to move in multiple directions.

FIGS. 5D and 5E show side views of the clip 500 when the first wall 530 is in the first and second positions shown in FIGS. 5B and 5C. In FIG. 5D, the clip 500 is in the first position (corresponding to FIG. 5B), and the second portion 532B of the first wall 530 is generally aligned with the second end 511B of the baseplate 510. When the first wall 530 is in the first position, the interior space 550 that is defined between the first wall 530 and the second wall 540 has a width W1, and the gap 560 that is defined between the inward projection 534 of the first wall 530 and the inward projection 544 of the second wall 540 has a width W2. With the first wall 530 in the first position, the interior space 550 and the gap 560 are able to accommodate cables 501A-501G.

In FIG. 5E, the clip is in the second position (corresponding to FIG. 5C), and the second portion 532B of the first wall 530 extends past the second end 511B of the baseplate 510. When the first wall 530 is in the second position, the interior space 550 has a width W3 that is larger than the width W1, and the gap 560 has a width W4 that is larger than the width W2. With the first wall 530 in the second position, the interior space 550 and the gap 560 are able to accommodate cables 501H-501N, which occupy a larger volume than cables 501A-501G. Thus, clip 500 allows the first wall 530 to be moved between various positions to accommodate different numbers of cables, different volumes of cables, different types of cables, etc.

Generally, any of clips 100, 300, 400, and 500 can be modified in various ways. For example, in some implementations, any of the clips 100, 300, 400, and 500 can include a center projection between two resilient fingers. In other implementations, any of the clips 100, 300, 400, and 500 can exclude the center projection, and includes only the two resilient fingers. In some implementations, any of the clips 100, 300, 400, and 500 can include more or less than the two resilient fingers shown herein. In some implementations, various aspects of different clips can be combined. For example, a clip according to aspects of the present disclosure could include a first wall similar to the first wall 430 (with the movable portion 432B and the projection 434) of clip 400, and a second wall similar to the second wall 440 (with the cavity 446) of the clip 400. However, the first wall in this example clip could be movable, similar to the first wall 530 of the clip 500.

Any of the clips 100, 300, 400, and 500 can be made from any suitable material. Generally, any resilient fingers of any of the clips 100, 300, 400, and 500 will be made from a resilient material that is biased toward a specific position. In some implementations (such as implementations of clips 100 and 300), the first wall and the second wall are made from a resilient material that is biased toward a specific position. Other portions of any of the clips 100, 300, 400, and 500 could be made from a non-resilient material.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A clip for securing one or more cables associated with a computing device, the clip comprising:
a baseplate;
a first wall extending from the baseplate, the first wall having a first inward projection at a distal end thereof, the first wall being movably coupled to the baseplate such that the first wall is movable relative to the baseplate between at least a first position and a second position; and
a second wall extending from the baseplate, the second wall having a second inward projection at a distal end thereof, the first wall being generally parallel to the second wall, the first wall and the second wall being spaced apart from each other by an interior space configured to receive the one or more cables, the first inward projection and the second inward projection aiding in preventing the one or more cables from moving outside of the interior space.

2. The clip of claim 1, wherein a gap is defined between the first inward projection and the second inward projection, and wherein a width of the gap between the first inward projection and the second inward projection is less than a width of the interior space.

3. The clip of claim 1, wherein when the first wall moves between the first position and the second position, the first wall moves toward or away from the second wall, such that a width of the interior space is adjustable.

4. The clip of claim 1, wherein the first wall includes a first portion coupled to an underside of the baseplate, and a second portion extending from the first portion, the second portion being generally parallel to the second wall.

5. The clip of claim 4, wherein the underside of the baseplate includes at least one boss extending therefrom, and wherein the first portion of the first wall includes at least a first aperture and a second aperture defined therein, the at least one boss being configured to mate with the first aperture when the first wall is in the first position, the at least one boss being configured to mate with the second aperture when the first wall is in the second position.

6. A clip for securing one or more cables associated with a computing device, the clip comprising:
a baseplate;
a first wall extending from the baseplate, the first wall having a stationary portion coupled to the baseplate and a movable portion coupled to the stationary portion that is movable relative to the stationary portion between at least a closed position and an open position, the first wall including a projection extending from the movable portion; and
a second wall extending from the baseplate, the first wall and the second wall being spaced apart from each other by an interior space configured to receive the one or more cables, the second wall being configured to be coupled to the first wall when the movable portion is in the closed position and not when the movable portion is in the open position, the second wall including a cavity defined at a distal end thereof, the cavity being sized to receive the projection of the first wall to secure the movable portion of the first wall in the closed position,
wherein the projection of the first wall includes a shoulder and the distal end of the second wall includes an overhanging ledge that forms a side of the cavity, and wherein in response to the cavity receiving the projection of the movable portion, the shoulder is positioned between the overhanging ledge and a bottom floor of the cavity, such that the projection is secured within the cavity.

7. The clip of claim 6, wherein when the movable portion of the first wall is in the closed position, the interior space is bound on at least four sides by the baseplate, the stationary portion of the first wall, the movable portion of the first wall, and the second wall.

8. The clip of claim 7, wherein when the movable portion of the first wall is in the closed position, the movable portion of the first wall is (I) generally parallel to the baseplate, and (ii) generally perpendicular to (a) the stationary portion of the first wall and (b) the second wall.

9. A clip for securing one or more cables associated with a computing device, the clip comprising:
a baseplate;
a first wall extending from the baseplate;
a second wall extending from the baseplate, the second wall being generally parallel to the first wall, the first wall and the second wall being spaced apart by an interior space configured to receive the one or more cables;
a first resilient finger extending from a first end of the baseplate; and
a second resilient finger extending from the first end of the baseplate, the second resilient finger being generally parallel to the first resilient finger, the first resilient finger and the second resilient finger being generally perpendicular to the first wall and the second wall, the first resilient finger and the second resilient finger aiding in coupling the baseplate to an attachment point,
wherein the attachment point is an attachment plate that includes a first sidewall and a second sidewall defining a slot therebetween, at least a portion of the baseplate being configured to be inserted into the slot between the first sidewall and the second sidewall to couple the clip to the attachment plate.

10. The clip of claim 9, wherein:
the first resilient finger includes a first shoulder portion extending outward from the first resilient finger in a first lateral direction;
the second resilient finger includes a second shoulder portion extending outward from the second resilient finger in a second lateral direction that is parallel to and opposite from the first lateral direction;
the baseplate includes a third shoulder portion extending laterally outward from a second end of the baseplate in the first lateral direction; and
the baseplate includes a fourth shoulder portion extending laterally outward from the second end of the baseplate in the second lateral direction.

11. The clip of claim 10 wherein the first resilient finger and the second resilient finger are each movable between a respective first position and a respective second position.

12. The clip of claim 11, wherein when at least the portion of the baseplate is inserted into the slot and the first resilient finger and the second resilient finger are in their respective first positions, (i) the first sidewall is positioned between the first shoulder portion and the third shoulder portion and (ii) the second sidewall is positioned between the second shoulder portion and the fourth shoulder portion, to thereby prevent the baseplate from being removed from the slot.

13. The clip of claim 12, wherein when the first resilient finger and the second resilient finger are in their respective second positions, (i) the first sidewall is not positioned between the first shoulder portion and the second shoulder portion and (ii) the second sidewall is not positioned between the third shoulder portion and the fourth shoulder portion, to thereby allow the baseplate to be removed from the slot.

14. The clip of claim 11, wherein the first resilient finger and the second resilient finger move toward or away from each other when moving from the respective first positions to the respective second positions.

15. The clip of claim 11, wherein the first resilient finger and the second resilient finger are both biased toward the respective first positions.

16. The clip of claim 9, wherein the attachment plate is located within a housing of the computing device.

* * * * *